(12) United States Patent
Bridges et al.

(10) Patent No.: US 7,654,398 B2
(45) Date of Patent: Feb. 2, 2010

(54) CABLE MANAGEMENT SYSTEM WITH ADJUSTABLE LENGTH ARM

(75) Inventors: Jeremy Bridges, Apex, NC (US); John G. Gundlach, Cary, NC (US); Joel E. Walker, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 614 days.

(21) Appl. No.: 11/184,209

(22) Filed: Jul. 19, 2005

(65) Prior Publication Data

US 2007/0017883 A1    Jan. 25, 2007

(51) Int. Cl.
 *A47F 7/00* (2006.01)
(52) U.S. Cl. ........................................................ 211/26
(58) Field of Classification Search .................... 211/26, 211/175, 162; 248/282.1; 312/223.2; 361/826
See application file for complete search history.

(56) References Cited

U.S. PATENT DOCUMENTS

| | | | | |
|---|---|---|---|---|
| 4,614,383 A | * | 9/1986 | Polley et al. | 312/273 |
| 6,070,742 A | * | 6/2000 | McAnally et al. | 211/26 |
| 6,303,864 B1 | * | 10/2001 | Johnson et al. | 174/69 |
| 6,305,556 B1 | * | 10/2001 | Mayer | 211/26 |
| 6,600,665 B2 | * | 7/2003 | Lauchner | 361/826 |
| 6,615,992 B1 | * | 9/2003 | Lauchner et al. | 211/26 |
| 6,747,874 B2 | * | 6/2004 | McKinnon et al. | 361/724 |
| 6,854,605 B2 | * | 2/2005 | Wrycraft | 211/26 |
| 6,945,504 B2 | * | 9/2005 | Chen et al. | 248/282.1 |
| 7,168,576 B2 | * | 1/2007 | Williams | 211/26 |

* cited by examiner

*Primary Examiner*—Sarah Purol
(74) *Attorney, Agent, or Firm*—Cynthia Seal, Esq.; Steven M. Greenberg, Esq.; Carey, Rodriguez, Greenberg & Paul, LLP

(57) ABSTRACT

A cable management system includes an adjustable length arm adapted to receive at least one cable in a computer system, and the adjustable length arm is configured to be connected to a first hinge and a second hinge that respectively define first and second opposite ends of the adjustable length arm. The first hinge is connected to a portion of the computing system, and the at least one cable and second hinge are connected to a movable device that moves relative to the portion of the computing system.

20 Claims, 3 Drawing Sheets

CABLE MANAGEMENT SYSTEM WITH ADJUSTABLE LENGTH ARM

BACKGROUND OF THE INVENTION

1. Field of the Invention

The disclosure relates generally to cable management systems and, more specifically, to a system for managing cables between two devices in a computer system that move relative to one another.

2. Description of the Related Art

An issue common to many types of computer systems is the management of cables that connect one device in the computer system to another. Many different types of cable management systems have been employed to prevent the cables from interfering with the operation of the computer system and/or preventing damage to the cables. For many devices, which do not move relative to one another, the management of the cables is straightforward in that the cables, once placed, rarely move. However, for devices that move relative to one another, additional issues may need to be addressed by a cable management system employed between the devices.

An example of devices moving relative to one another is a server in a server rack. The server, which is connected by one or more cables to the rack itself or other devices associated with the rack, is typically configured to slide in and out of the rack while the cables are still connected to the server. One type of cable management system being currently employed is the use of a shelf upon which the cables rest. However, the shelf does not completely support the cables, and the cables tend to sag below the server. Another type of cable management system being currently employed is the use of a fixed-length arm with a hinge in the middle of the arm. This arm, however, also sags below the server.

With the cables and/or arm sagging below the server, the cable and/or arm may interfere with a unit below the server. This problem is particular prevalent in server racks in which servers are stacked one on top of the other with little spacing between servers.

BRIEF SUMMARY OF THE INVENTION

Embodiments of the invention address deficiencies of the art in respect to cable management systems and provide a novel and non-obvious system for managing cables connected to a movable device within a computer system. A cable management system includes an adjustable length arm adapted to receive at least one cable, and the adjustable length arm is configured to be connected to a first hinge and a second hinge that respectively define first and second opposite ends of the adjustable length arm. The first hinge is connected to a portion of the computing system, and the cable and second hinge are connected to a movable device that moves relative to the portion of the computing system.

The first and second hinges each limit rotation about a single angle axis, and the rotation axis of the first hinge is substantially parallel to the rotation axis of the second hinge. An extension portion may be included for connecting the adjustable length arm to the movable device, and the second hinge connects the extension portion to the adjustable length arm. The second hinge is positioned at a constant distance away from the movable device. The adjustable length arm includes at least two adjustable length arm portions that move relative to one another, and the two adjustable length arm portions move relative to one another along a longitudinal axis of the adjustable length arm.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
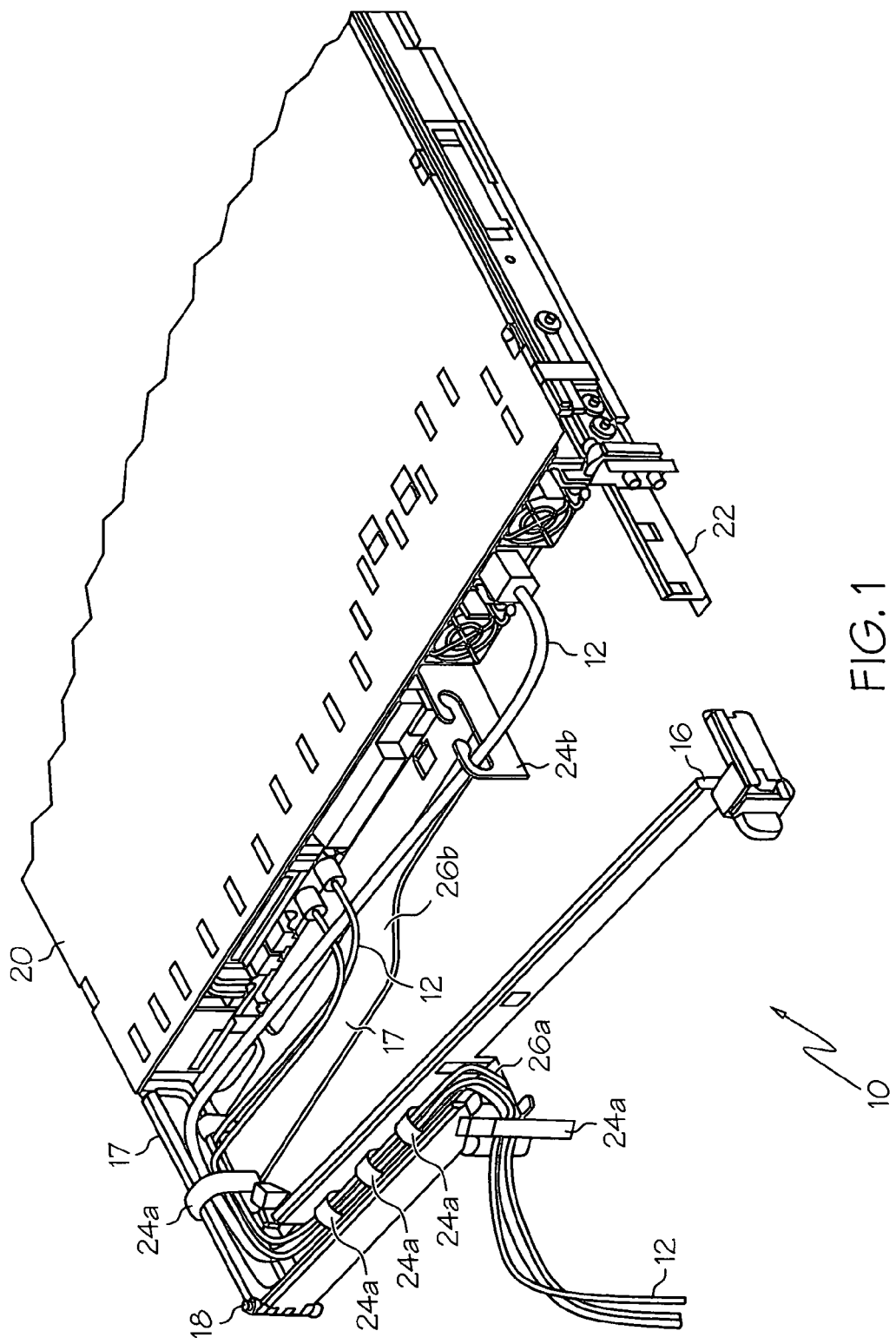
FIG. 1 is a perspective illustration of a cable management system in accordance with the inventive arrangements.
Figure 2:
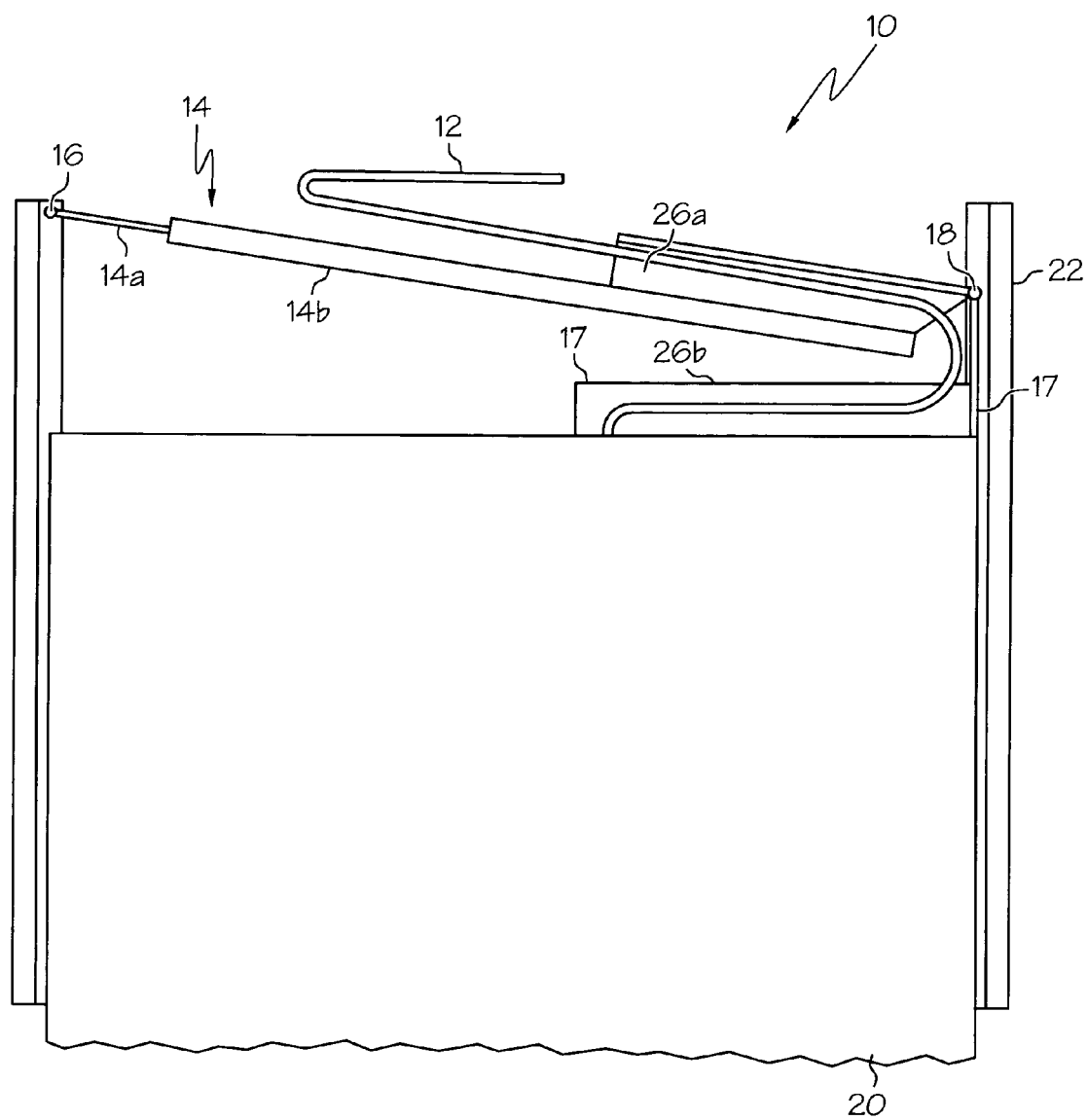
FIG. 2 is a top plan schematic illustration of the cable management system in a partially closed configuration.
Figure 3:
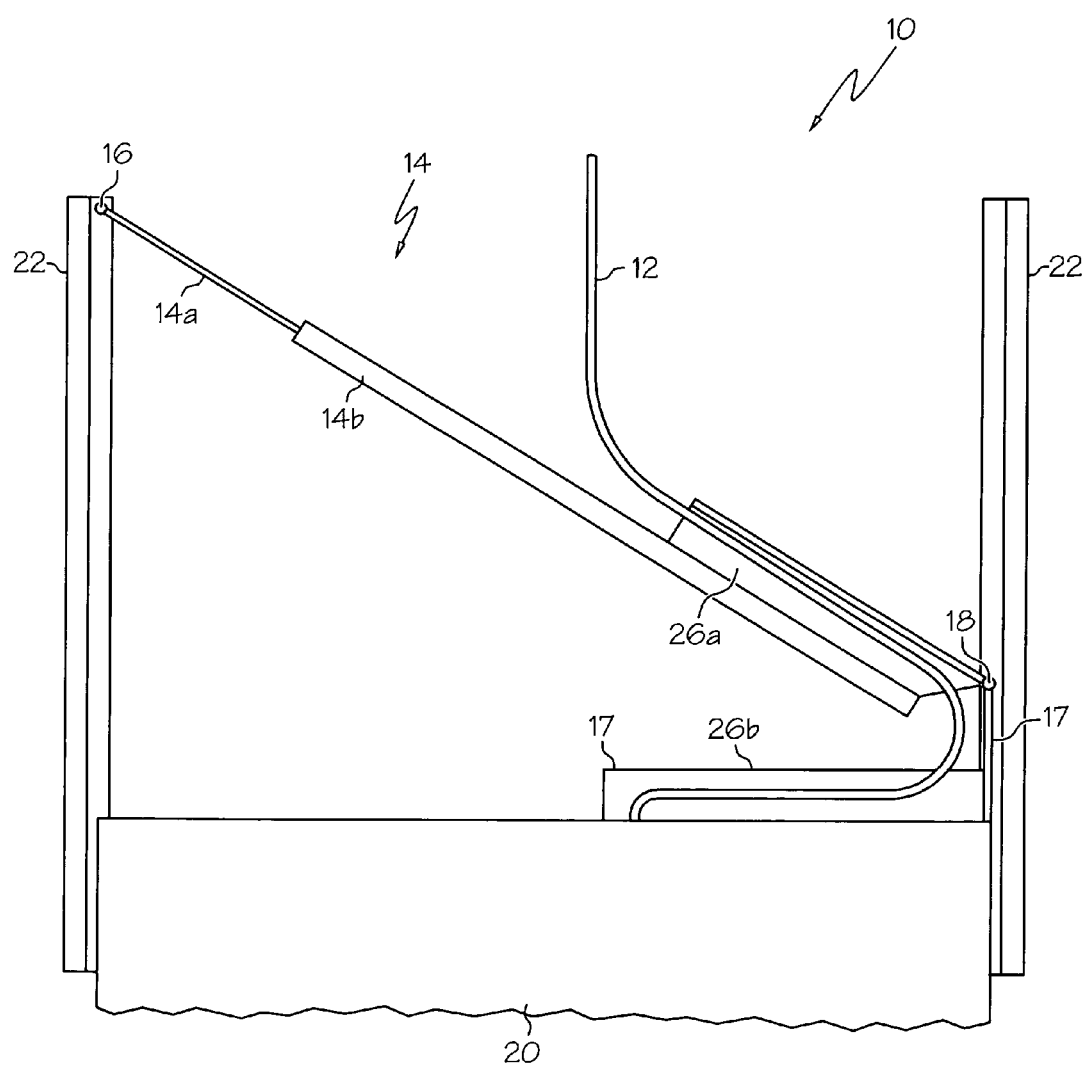
FIG. 3 is a top plan schematic illustration of the cable management system in a partially open configuration.

FIGS. 1-3 illustrate a cable management system 10 for managing one or more cables of a computer system, and the cables 12 are connected to a movable device 20. The movable device 20 moves relative to a portion 22 of the computing system. The cable management system 10 includes an adjustable length arm 14 that receives the cables 12, and the adjustable length arm 14 is attached to first and second hinges 16, 18 at both ends of the adjustable length arm 14, respectively. The first hinge 18 is attached to the movable device 20, and the second hinge is attached to the portion 22 of the computing system relative to which the movable device 20 moves.

Although not limited in this manner, the movable device 20 illustrated in FIG. 1 is a server, and a portion 22 of the computing system relative to which the movable device 20 moves is a rack. Another example of a movable device 20 is a hard drive. Yet another example is a tray of DVD player that includes the reader within the tray. In each example, the movable device 20 is connected to one or more cables 12, and the movable device 20 moves (e.g., translates, rotates, or other type of movement) relative to a portion 22 of a computing system. Solely for ease of discussion, the movable device 20 is hereinafter referred to as the server 20, and the portion 22 of the computing system is hereinafter referred to as the rack 22.

Many types of hinges are known, and the first and second hinges 16, 18 are not limited as to a particular type of hinge. However, in certain aspects of the cable management system 10, the first and second hinges 16, 18 limit rotation to a single axis, and the first and second hinges 16, 18 are positioned such that the rotation axis of the first and second hinges 16, 18 are parallel.

The first and second hinges 16, 18 may be included within the arm 14. Alternatively, one or both of the first and second hinges 16, 18 may be included within the rack 22 and the server 20. In yet another alternative, one or both of the first and second hinges 16, 18 may include portions that are located within both the arm 14 and the rack 22/server 20.

The cable management system 10 may also include an extension portion 17 that is attachable to the server 20. The extension portion 17 is attached to the second hinge 18 and extends the second hinge 18 away from the server 20. In this configuration, although the second hinge 18 is not directly connected to the server 20, the second hinge 18 may be positioned at a constant distance away from the server 20. Also by positioning the second hinge 18 away from the server 20, the radius of curvature of the cables 12 increases proximate the second hinge 18.

As illustrated in the figures, the first hinge 16 is located on one side of the rack 22, and the second hinge 16 is located on an opposite side of the rack 22. By locating the hinges 16, 18 on opposite sides of the rack 22, the server 20 may be moved both closer to and farther away from the first hinge 16 for an adjustable length arm 14 having a certain range of lengths. The positioning of the first and second hinges 16, 18, however, are not limited in this manner. For example, the first hinge 16 may be located at an approximate middle point between the two sides of the rack 22 and the second hinge 18 may be located on either side of the rack 22, or the first hinge 16 may be located on either side of the rack 22 and the second hinge 18 may be located at an approximate middle point of the server 20.

Many types of adjustable length arms 14 are capable of both extending and retracting in length, and the cable management system 10 is not limited as to a particular type of adjustable length arm 14. For example, an adjustable length arm 14 may include three or more pieces that move relative one another. Although not limited in this manner, the adjustable length arm 14 (best illustrated in FIGS. 2 and 3) includes a first adjustable length arm portion 14a slidably connected to a second adjustable length arm portion 14b to effectively change the length of the adjustable length arm 14. The first adjustable length arm portion 14a may move relative to the second adjustable length arm portion 14b along a longitudinal axis of the adjustable length arm 14.

Although not limited in this manner, the adjustable length arm 14 is configured to minimize sagging of the adjustable length arm 14. The minimization of sagging can be accomplished, for example, by reducing the weight of the adjustable length arm 14 by using lightweight materials and/or using a honeycombed material. Sagging of the adjustable length arm 14 can also be minimized by using a rigid material. By minimizing sagging of the adjustable length arm 14, stress on the cables 12 caused by sagging can be reduced, and interference with other devices in the computer system by the cables 12 and/or arm 14 can be reduced. Sagging may also interfere with the operation of the hinges 16, 18.

The cable management system 10 may also include support portions to support and/or restrain movement of the cables 12. The support portions may be part of the adjustable length arm 14, part of the extension piece 14, or a separate portion altogether. Examples of support portions include loops 24a of hook and loop material that may be directly attached to the cable management system 10 or attachable to the cable management system 10. Another example of a support portion is a bracket 24b.

Another example of support portions are channels or flat portions 26a, 26b into or onto which the cables 12 may rest. For example, as illustrated in FIG. 1, the adjustable length arm 14 includes a channel 26a into which the cables may be positioned. A flat portion 26b is illustrated as a portion being separate from, but connected to, the adjustable length arm 14. Although not limited in this manner, the flat portion 26b may be part of the extension portion 17 that is attached to the server 20.

What is claimed is:

1. A cable management system for managing at least one cable of a computer system, the at least one cable connected to a movable device, comprising:
   an adjustable length arm adapted to receive the at least one cable, the adjustable length arm configured to be connected to a first hinge and a second hinge, the first and second hinges respectively defining first and second opposite ends of the adjustable length arm, wherein
   the second hinge is connected to the movable device, and the first hinge is connected to a portion of the computing system relative to which the movable device moves.

2. The cable management system according to claim 1, wherein the adjustable length arm includes the first hinge and the second hinge.

3. The cable management system according to claim 1, wherein the first and second hinges each limit rotation about a single angle axis.

4. The cable management system according to claim 3, wherein the rotation axis of the first hinge is substantially parallel to the rotation axis of the second hinge.

5. The cable management system according to claim 1, further comprising an extension portion for connecting the adjustable length arm to the movable device, the second hinge connecting the extension portion to the adjustable length arm.

6. The cable management system according to claim 5, wherein second hinge is positioned at a constant distance away from the movable device.

7. The cable management system according to claim 1, wherein the adjustable length arm includes at least two adjustable length arm portions that move relative to one another.

8. The cable management system according to claim 1, wherein the at least two adjustable length arm portions move relative to one another along a longitudinal axis of the adjustable length arm.

9. A computer system, comprising:
   a first device;
   a second device movable relative to the first device;
   at least one cable connected to the second device; and
   an adjustable length arm adapted to receive the at least one cable, the adjustable length arm including a first hinge and a second hinge, the first and second hinges respectively defining first and second opposite ends of the adjustable length arm, wherein
   the first hinge is connected to the first device, and the second hinge is connected to the second device.

10. The computer system according to claim 9, wherein the first and second hinges each limit rotation about a single angle axis.

11. The computer system according to claim 10, wherein the rotation axis of the first hinge is substantially parallel to the rotation axis of the second hinge.

12. The computer system according to claim 9, further comprising an extension portion for connecting the adjustable length arm to the second device, the second hinge connecting the extension portion to the adjustable length arm.

13. The computer system according to claim 12, wherein second hinge is positioned at a constant distance away from the second device.

14. The computer system according to claim 9, wherein the adjustable length arm includes at least two adjustable length arm portions that move relative to one another.

15. A server storage system, comprising:
    a server rack;
    a server movable relative to the server rack;
    at least one cable connected to the sever; and an adjustable length arm adapted to receive the at least one cable, the adjustable length arm including a first hinge and a second hinge, the first and second hinges respectively defining first and second opposite ends of the adjustable length arm, wherein the second hinge is connected to the server.

16. The computer system according to claim 15, wherein the first and second hinges each limit rotation about a single angle axis.

17. The computer system according to claim 6, wherein the rotation axis of the first hinge is substantially parallel to the rotation axis of the second hinge.

18. The computer system according to claim 16, further comprising an extension portion for connecting the adjustable length arm to the server, the second hinge connecting the extension portion to the adjustable length arm.

19. The computer system according to claim 18, wherein second hinge is positioned at a constant distance away from the server.

20. The computer system according to claim 15, wherein the adjustable length arm includes at least two adjustable length arm portions that move relative to one another.

* * * * *

UNITED STATES PATENT AND TRADEMARK OFFICE
CERTIFICATE OF CORRECTION

PATENT NO. : 7,654,398 B2
APPLICATION NO. : 11/184209
DATED : February 2, 2010
INVENTOR(S) : Bridges et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1124 days.

Signed and Sealed this

Twenty-third Day of November, 2010

David J. Kappos
*Director of the United States Patent and Trademark Office*